United States Patent
Penny

[11] Patent Number: 5,471,164
[45] Date of Patent: Nov. 28, 1995

[54] MICROWAVE AMPLIFIER LINEARIZER

[76] Inventor: James R. Penny, Indutec, Inc. P.O. Box 4328, Fayetteville, Ark. 72702-4328

[21] Appl. No.: 393,281

[22] Filed: Feb. 23, 1995

[51] Int. Cl.⁶ ............................... H03F 1/26; H03F 3/60
[52] U.S. Cl. ............................ 330/149; 330/56; 330/306
[58] Field of Search ................................ 330/53, 56, 149, 330/286, 302, 306; 333/175, 176, 202, 203

[56] References Cited

U.S. PATENT DOCUMENTS

| | | | |
|---|---|---|---|
| 4,531,098 | 7/1985 | Reed | 330/53 |
| 5,038,113 | 6/1991 | Katz et al. | 330/277 |
| 5,066,933 | 11/1991 | Komeda | 333/204 |
| 5,117,197 | 5/1992 | Hsu et al. | 330/149 |
| 5,237,288 | 8/1993 | Cleveland | 330/107 |

*Primary Examiner*—Steven Mottola
*Attorney, Agent, or Firm*—Head & Johnson; Robert R. Keegan

[57] ABSTRACT

There is disclosed a system for linearizing an RF amplifier by the application of suitable load impedances to its 2nd, 3rd, and higher order output signals, thereby reducing output distortion products and improving performance. Intermodulation Distortion (IMD) reduction results from controlled termination of harmonic tuned filters produced by impedance selection and/or filter detuning. Preferably the apparatus comprises parallel band-pass filters including a filter passing the fundamental signals only; a filter passing 2nd harmonics; and a filter passing the 3rd harmonics. These, and optionally higher order filters, are employed for suppressing harmonic frequencies and reducing IMD. Preferably all filters have sufficient isolation to prevent serious interaction between filters. Therefore a selected mismatch provided at each of the harmonic output ports linearizes the amplifier's output. In some applications it is useful to mistune the filter to create a load impedance mismatch to cause the desired Intermodulation Distortion reduction. The system may be at the front end and/or output of an RF amplifier. Utilizing a suitable probing device the system may be used as a testing tool or for screening MIMIC RF amplifiers still in wafer form, or may be used to select a suitable load impedance for the MIMIC for later correction of IMD time or for selecting MIMICS which exhibit better IMD characteristics.

19 Claims, 3 Drawing Sheets

MICROWAVE AMPLIFIER LINEARIZER

SUMMARY OF THE INVENTION

The present invention relates to systems and apparatus for linearizing RF amplifiers, particularly microwave frequency amplifiers (for the purposes of the present description microwave is considered to describe frequencies above 100 MHz) by reducing output distortion products and, particularly, intermodulation distortion. In preferred embodiments of the invention an arrangement of low loss waveguide filters or other microwave filters includes filters configured and tuned for minimal insertion loss for the fundamental frequency, for the second order of frequency, for the third order of frequency, and, optionally, higher order frequency filters. The fundamental frequency filter output is directed to an antenna or other utilization device but the filters for harmonic frequencies are terminated in a mismatch so that, in effect, they produce a cancellation signal for the respective harmonics generated by the non-linearity of the RF amplifier.

Linearizers for microwave RF amplifiers and/or frequency RF amplifiers have been known and used for many years. It has long been observed and known that when harmonic products are present in the output of an RF amplifier, the tendency to generate intermodulation distortion products (IMD) is great, and mixing products occur creating unwanted additional frequencies in the amplifier power spectrum. Numerous approaches distinctively different from that of the present invention have been employed in efforts to linearize RF amplifiers and reduce their distortion, among which are predistortion systems or feedforward systems, feedback systems, and amplifier output impedance mismatch systems. Output impedance mismatch systems are distinguished from the present invention in that the fundamental and harmonic outputs of the RF amplifier all see the same load and alterations in the load parameters to suppress harmonic output and reduce distortion and can only be obtained at the cost of reducing overall best performance in power output. Thus, while amplifier load mismatch may, in some cases, reduce harmonic output by a greater factor than desired fundamental output is reduced, only modest improvements in linearity are achieved and those at the cost of significant reduction in desired power output.

It should also be noted that parallel band-pass filters having harmonically related frequencies which are important elements of Applicant's apparatus configuration are well known for use as multiplexors and for other uses. A typical multiplexor is a multiple output filter device which divides a wider pass band of frequencies into several or many narrower frequency bands which are usually nearly contiguous. Typically, each of the narrower bands within the wider pass band represents a separate information channel for audio/video or data transmission. Thus, the conventional multiplexor is functionally different from Applicant's apparatus and is also of different physical structure since the impedances of the component filter devices are selected to permit the respective narrow frequency band to pass with relatively low loss and to provide at least the minimum necessary isolation between the various information signals. To this end, the impedance of each filter device is generally matched to be the same as each other as in a 50 ohm system or some system of other desired power transfer impedance. Multiplexors do not commonly have filters which are all harmonic frequency related. More specific examples of such prior amplifier linearizer systems or multiple filter multiplexor systems will be found in the Appendix of Prior Publications and Patents, below.

While the preferred embodiment of the invention, which is illustrated in most detail, employs filters of waveguide form, the transmission line with which the filters are associated is not limited to waveguide transmission line. For example, coaxial transmission line or two-wire transmission line or other known forms of transmission line could be substituted in whole or in part for the waveguide transmission line of the principal and preferred embodiment of the invention described hereinafter. It is an important consideration, however, that the filters for the linearizer comprise resonant circuits or resonators with a very high Q (quality factor) on the order of thousands or tens of thousands. Q or quality factor is generally described as 2 Pi times the ratio of the maximum stored energy to the energy dissipated per cycle at a given frequency. Implicit in this requirement of high Q is the fact that coils or conventional inductors would be unsuitable for use in filters at microwave frequencies because their Q is determined by the ratio of their reactance to their effective series resistance and, barring the use of superconductors, inductor resistance would produce unacceptably low Q.

High Q resonators for low power microwave applications are available as alternatives to waveguide type resonators and include dielectric resonators and the like which can provide a Q of ten thousand or more at frequencies in the vicinity of 1 gigahertz and above. Therefore, it will be understood in the following discussion where a generalized lumped element circuit diagram representation of a microwave amplifier linearizer according to the invention is described, coils and capacitors shown in the diagram actually represent reactance parameters of high Q resonators rather than physical coils or capacitors.

In addition to providing the above described features and advantages, it is an object of the present invention to provide an amplifier linearizer including parallel-connected filters configured to reduce the harmonics of a radio frequency amplifier by correcting the 2nd and 3rd, and, possibly, higher orders of the power spectrum.

It is another object of the present invention to provide active and/or passive means of linearizing an RF amplifier by appropriately connecting selected impedances thereto, each of which is associated with a particular harmonic whereby significant and dramatic improvement in RF amplifiers (relative to IMD products particularly) results from harmonically related load impedance mismatching.

It is still another object of the present invention to provide such a configuration of parallel connected filters wherein each of such filters has a very low filter insertion loss associated with the power of a particular harmonic frequency.

It is yet another object of the present invention to provide an RF amplifier linearizer wherein the parallel connected filters thereof utilize high Q resonators to achieve very low filter insertion loss thereby maximizing possible distortion correction by reduction of harmonic components of the power spectrum.

It is yet another object of the present invention to provide an RF amplifier linearizer for microwave frequencies having a parallel filter configuration wherein the filters are implemented in waveguide transmission line with multiple resonator rods and configured to provide desired filter characteristics thereby rendering the linearizer useful for power amplifiers with outputs of up to 100 watts and more.

Other objects of the invention will be apparent from consideration of the following description in conjunction with the appended drawings which are described below.

DETAILED DESCRIPTION

Figure 1:
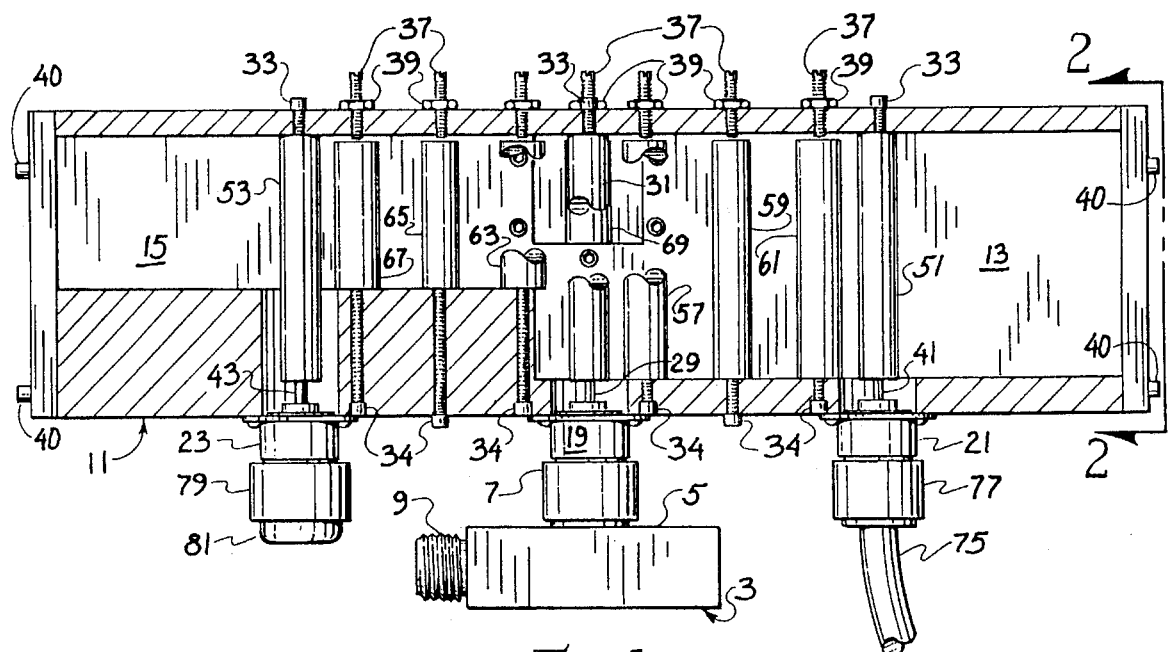
FIG. 1 is a vertical sectional view of a waveguide implementation of a Microwave Amplifier Linearizer according to the invention.
Figure 2:
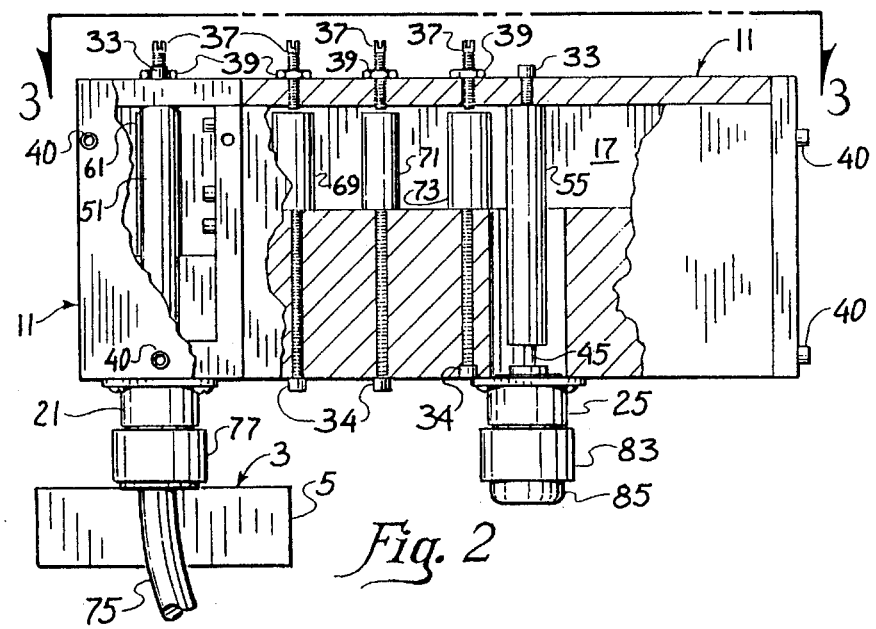
FIG. 2 is a vertical, sectional view of the apparatus of FIG. 1 taken along the line 2—2 in FIG. 1.
Figure 3:
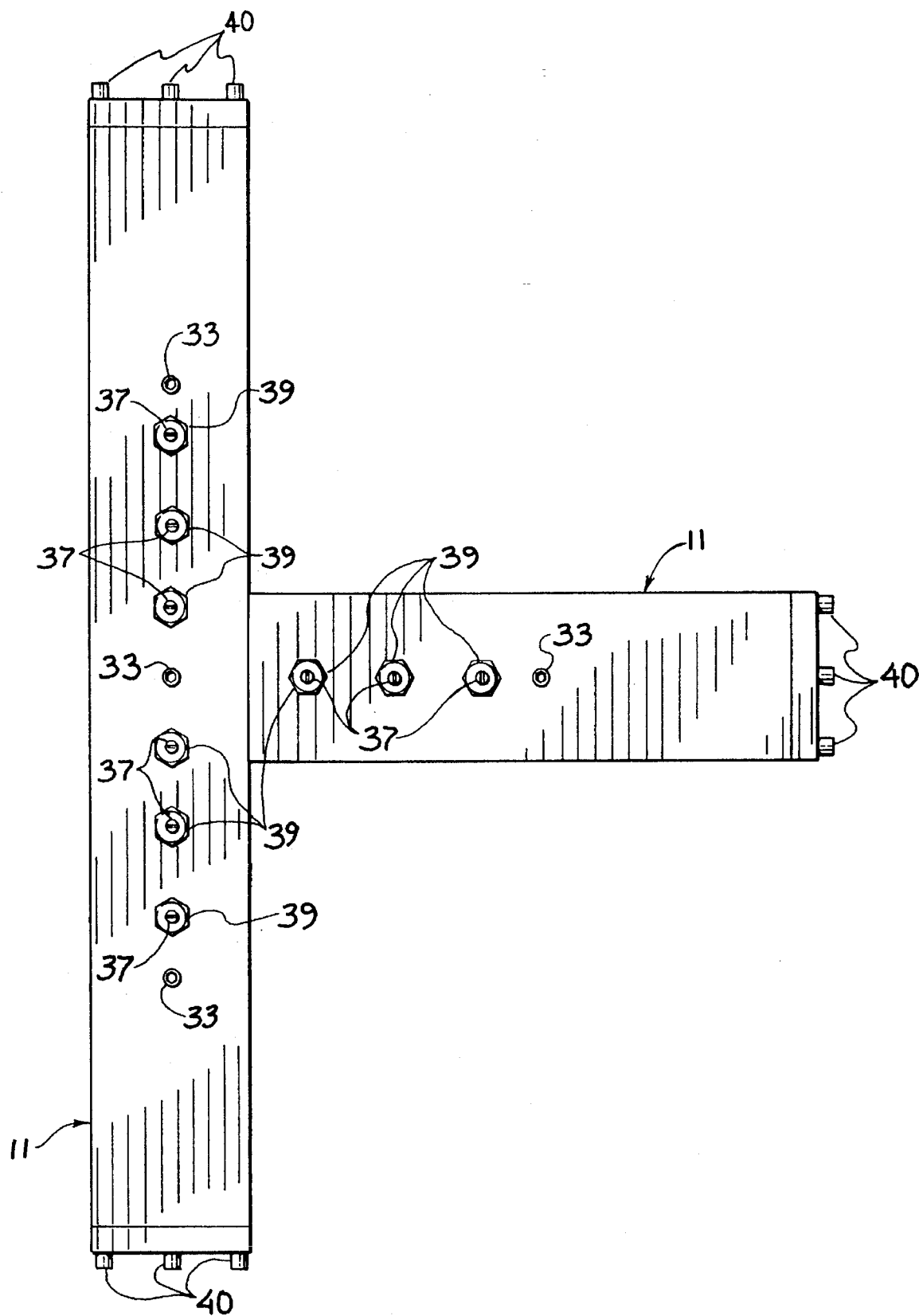
FIG. 3 is a top plan view of the apparatus of FIGS. 1 and 2.

Referring now to the drawings, and particularly FIGS. 1, 2 and 3, a preferred embodiment of the invention for high power applications is shown with a linearizer housing 11. Three comb line filters are contained within the housing 11 residing respectively in waveguide transmission line sections 13, 15, and 17. The housing 11 is provided with a coaxial input fitting 19 and coaxial output fittings 21, 23, and 25. Housing 11 may be machined from aluminum stock and assembled using machine screws 40.

A microwave radio frequency amplifier 3 of conventional type may be arranged with its housing 5 in close proximity to the linearizer housing 11 and with its output coaxial fitting 7 operatively connected to the coaxial fitting 19 of the linearizer. Microwave amplifier linearizer 3 is provided with a coaxial input 9 or other form of input to receive the information signal to be amplified.

The center conductor 29 from coaxial input 19 is coupled to rod 31 which serves as an input coupling rod. The linearizer shown in FIGS. 1 and 2 is constructed of aluminum or other conductive metal, but it will be appreciated that housing 11, rod 31, and other rods in the structure could be formed of electroplated plastic or in any other manner which would provide the conductivity for the wall surfaces and rod surfaces which is desired. In general, all conventional and known techniques for fabrication of combline filters can be employed to obtain the electrical characteristics necessary for implementation of the invention as described herein below. See, for example, U.S. Pat. No. 5,023,579 to Bentivenga et al. and references therein. Input coupling rod 31 is secured in electrically conductive relation to housing 11 by a machine screw 33 or other suitable means.

In similar fashion an output coupling rod 51 is secured in waveguide transmission line section 13 by machine screw 33 and is coupled to coaxial output fitting 21 by a coaxial center conductor 41; output coupling rod 53 is secured in waveguide transmission line section 15 by machine screw 33 and is coupled to coaxial output fitting 23 by a coaxial center conductor 43; and output coupling rod 55 is secured in waveguide transmission line section 17 by machine screw 33 and is coupled to coaxial output fitting 25 by a coaxial center conductor 45.

The characteristics of the filter provided in waveguide transmission line 13 are primarily determined by resonator rods 57, 59, and 61 which are secured in electrically conductive relation to the housing 11 by machine screws 34. Each of resonators 57, 59, and 61 is associated with a tuning screw 37 whereby very precise tuning of resonant frequency and other characteristics of the filter may be obtained by known techniques. Each tuning screw 37 is provided with a lock nut 39.

The characteristics of the filter provided in waveguide transmission line 15 are primarily determined by resonator rods 63, 65, and 67 which are secured in electrically conductive relation to the housing 11 by machine screws 34. Each of the resonators 63, 65, and 67 is associated with a tuning screw 37 whereby precise tuning of resonant frequency and other characteristics of the filter may be obtained by known techniques. Each tuning screw 37 is provided with a lock nut 39.

The characteristics of the filter provided in waveguide transmission line 17 are primarily determined by resonator rods 69, 71, and 73 which are secured in electrically conductive relation to the housing 11 by machine screws 34. Each of the resonators 69, 71, and 73 is associated with a tuning screw 37 whereby precise tuning of resonant frequency and other characteristics of the filter may be obtained by known techniques. Each tuning screw 37 is provided with a lock nut 39.

The resonator set for each of the filters in waveguide transmission lines 13, 15, and 17, respectively, consists of three resonators; three resonators provide very effective filter operation but for other circumstances and situations it may be desirable to have a greater or lesser number of resonators than the three illustrated in the embodiment of FIGS. 1 and 2.

It will be observed that the waveguide transmission line 15 and the resonators therein are of lesser height than the waveguide transmission line 13 and the resonators therein. The construction makes it possible for the frequency pass band of the filter transmission line 15 to be double that of the frequency pass band of the filter of transmission line 13. Waveguide transmission line 17 and the associated resonators are of still lesser height and thus are able to provide a filter with frequency pass band of triple that of the filter of waveguide transmission line 13. In other words, the filter of waveguide transmission line 13 is tunable to the fundamental of the input from coaxial input fitting 19 and amplifier 3 while the filters of waveguide transmission lines 15 and 17 are tunable to the second and third harmonics thereof.

The output from coaxial fitting 21 is the useful output of the linearizer and is provided to the antenna or other desired utilization apparatus by a coaxial transmission line 75 or other suitable transmission line. Coaxial transmission line 75 is provided with an appropriate fitting 77 for connection to coaxial output fitting 21.

Since it is desired to suppress the second and third harmonic signals that would otherwise be produced by amplifier 3, according to the invention coaxial output fitting 23 has secured thereto a mismatch impedance element 81 with an appropriate coupling 79 for fitting 23. In a similar fashion coaxial output fitting 25 has secured thereto a suitable mismatch impedance element 85 with an appropriate coupling 83. Impedance elements with predetermined parameters are commercially available, for example, MMC precision standard mismatches from Maury Microwave Corporation, Ontario, Calif. It will be appreciated that in some cases these mismatch impedance units 81 and 85 may be adjustable and in other cases such mismatch impedance units may be built into the linearizer housing 11 rather than being externally connected.

While the embodiment of the linearizer illustrated in FIGS. 1 and 2 is highly effective by employing three filters and by suppressing the second and the third harmonic distortions, one or more additional filters could be employed in the linearizer to achieve even higher order harmonic separation. In some cases it may be desirable to replace the input coaxial connection 19 with a wafer probe fitting to implement the invention for production inprocess testing and evaluation.

Figure 4:
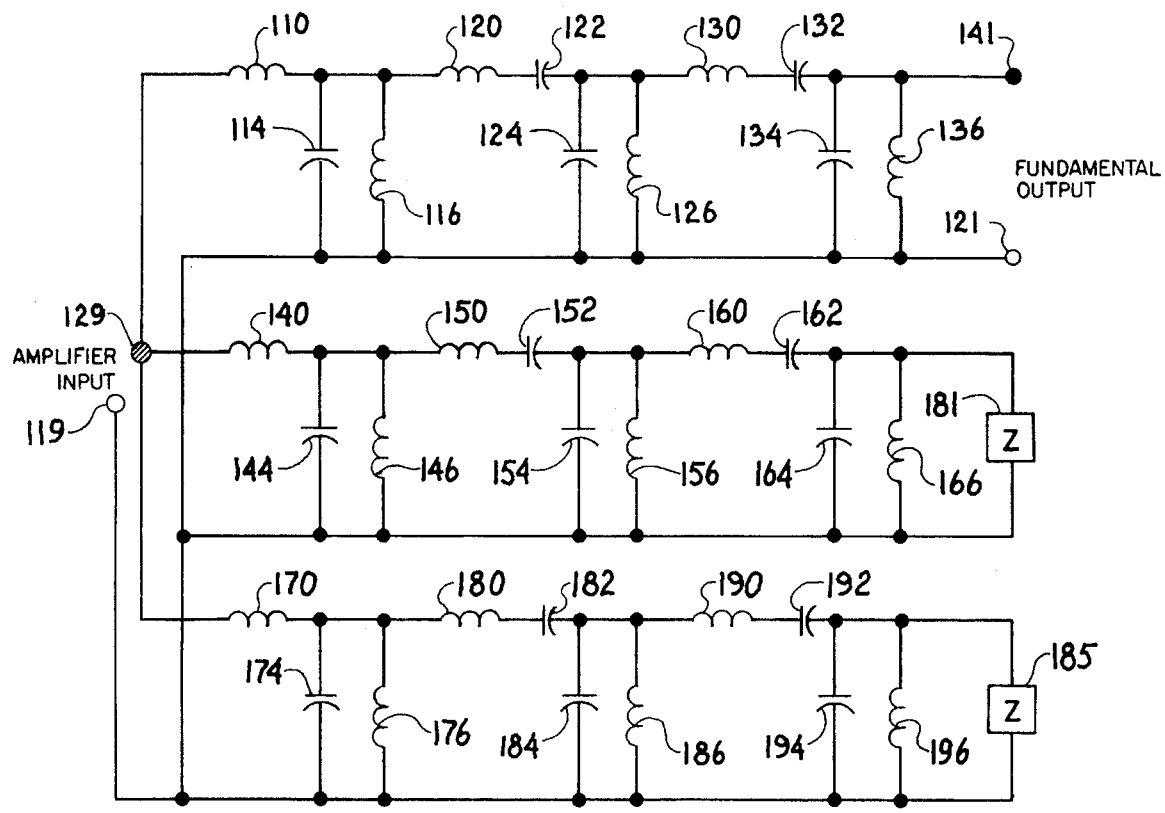
FIG. 4 is a generalized lumped element representation of the electronic circuitry of a Microwave Amplifier Linearizer according to the invention.

FIG. 4 shows a generalized lumped element representation of a microwave amplifier linearizer according to the invention. FIG. 4 is particularly useful to describe the operation of the microwave amplifier linearizer according to the invention, but it should be understood that coils and capacitors showing in FIG. 4 represent reactances of high Q filter resonators, and rarely, if ever, would conventional coils and conventional solid dielectric capacitors be used to implement the electronic circuitry of a microwave amplifier linearizer according to the invention. High Q resonators of the form known as dielectric resonators and other similar devices are commercially available, see for example, Kelf.1 Catalog-on-disk from K & L Microwave, Salisbury, Md. Also, it should be pointed out that in FIG. 4 only reactive elements rather than resistive elements are shown as it is desirable to obtain high Q in the resonator filters by reducing the resistances in the circuit to the maximum extent possible relative to the reactances. As a practical matter (except in the case of superconductor circuitry) there will unavoidably be some small resistances which should be taken into account.

Amplifier input for the circuit of FIG. 4 is at terminals 119 and 129 which may be considered to be connections for two-wire or coaxial, or, by analogy, any other form of transmission line.

The input at amplifier input terminal 119–129 divides into three parallel circuits, the upper one of which is provided with fundamental output terminals 121 and 141. Although two-wire terminals are indicated they may represent any form of transmission line.

The circuit of FIG. 4 is generally analogous to the waveguide implementation of the linearizer shown in FIGS. 1, 2, and 3 in that there are three parallel transmission lines with each such transmission line having a series of three resonators or resonant circuits associated therewith.

The first resonator of the upper transmission line circuit comprises conductive reactance 110, capacitive reactance 114, and inductive reactance 116. Following that is a resonator comprising inductive reactance 120, capacitive reactances 122 and 124, and inductive reactance 126. The third of the series of resonators comprises inductive reactance 130, capacitive reactances 132 and 134, and inductive reactance 136.

As is well known from electronic circuit theory, the characteristics of each of the resonators and also the characteristics of the resonator combination in terms of center frequencies, bandwidth, and the like, can be determined in a precise manner by appropriate selection of the reactance values for the inductive reactance and the capacitive reactance components. Theoretical computation, experimental techniques or a combination thereof may be used to determine such values. To the extent that resistance is not negligible, it must also be accounted for.

The second and third filter circuits in FIG. 4 are terminated with impedance elements 181 and 185 respectively; otherwise they are similar to the first filter circuit described but with different inductive reactance and capacitive reactance values to provide filter response at the second order harmonic frequency and the third order harmonic frequency respectively. Accordingly, in the second or middle filter circuit there is a first resonator comprising inductive reactance 140, capacitive reactance 144 and inductive reactance 146 followed by a second resonator comprising inductive reactance 150, capacitive reactances 152 and 154, and inductive reactance 156. The third, and in this example the last, resonator comprises inductive reactance 160, capacitive reactances 162 and 164, and inductive reactance 166.

The impedance 181 is not matched to the impedance of the transmission line of the filter but rather is an at least partial mismatch which, taken in conjunction with the tuning (or partial mistuning) of the resonators by appropriate selection of reactance values results in a high degree of cancellation of the second order harmonic frequency output of the amplifier input at terminal 119–129.

In almost identical fashion, except for frequency relation and parameter values, the third, and in this example last, filter circuit terminated by impedance 185 provides almost complete cancellation of the third order harmonic frequency produced by the amplifier at terminals 119 and 129. The third filter circuit having impedance 185 connected as a terminating impedance has a first resonator comprising inductive reactance 170, capacitive reactances 172 and 174, and inductive reactance 176, a second resonator comprising inductive reactance 180, capacitive reactances 182 and 184, and inductive reactance 186, and finally a third resonator comprising an inductive reactance 190, capacitive reactances 192 and 194, and inductive reactance 196.

It should again be noted that the filter circuit providing the fundamental output at terminals 121 and 141 must be designed to pass only the fundamental frequency and not second, third, or higher order harmonics thereof. Otherwise, the function of the second order frequency filter and the third order frequency filter would be adversely affected so that they would not be able to provide the cancellation previously described, and, furthermore, a relatively low loss path from the amplifier input to the linearizer output would be provided for the undesirable harmonics and for reflections of the undesired harmonics which would tend to produce further intermodulation distortion. However, it is permissible for this "fundamental" filter to be a low pass rather than a band-pass filter. In such case the stop band for the filter must be as low as or lower than the second harmonic zone.

The simplest design of microwave amplifier linearizer circuits according to the invention contemplates that the second order harmonic filter and the third order harmonic filter would also pass only their selected order harmonic and would not significantly pass higher order frequencies, particularly those which were multiples of the particular order harmonic which that harmonic filter was designed to pass. Such a design totally prevents harmful interaction between the second order harmonic frequency filter and the third order harmonic frequency filter, for example.

However, contrary to the situation with respect to the first order or fundamental frequency filter, there may be certain instances in which the second order harmonic frequency filter may also be allowed to pass double that frequency (or higher even-number multiples thereof). A frequency double that of the second order harmonic frequency is, of course, approximately that of the fourth order harmonic frequency. There will usually be more than sufficient separation between the fourth order harmonic frequency and the third order harmonic frequency to avoid adverse interaction between the second order frequency and the third order frequency filter when the second order frequency filter is permitted to pass the fourth order harmonic frequency as well. In fact, judicious variation of the parameters of the second order harmonic frequency filter may allow one to cancel fourth harmonic frequency distortion generated by the amplifier feeding the microwave linearizer. Even multiples of the third order harmonic frequency usually can be tolerated in that filter. Generally odd multiples of a filter pass band frequency should be suppressed to avoid deleterious interaction between filters.

Although the construction of combline microwave filters, and combline coupled circular rod filters in particular, is well known and conventional, specific dimensions and characteristics for the apparatus of FIGS. 1, 2, and 3 are given in the tables below. The dimensions and characteristics are for a microwave amplifier linearizer having a center frequency of 0.8200 GHz and a bandwidth of 0.0600 GHz, which would be useful for a power amplifier used in the transmitter for a mobile radio broadcast station, for example.

Table 1 gives the dimensions and parameters for the filter structure for the fundamental frequency while Tables 2 and 3 give the dimensions and parameters for the filter structures for the second order harmonic frequency and the third order harmonic frequency respectively. The values for impedance 81 and impedance 85 cannot be specified accurately without knowing the characteristics of the amplifier for which it is desired to provide cancellation of second and third harmonic components of its power spectrum. Preferably the determination of impedance values for impedances 181 and 185 (including impedance magnitude and phase angle) are determined by known techniques utilizing both computations based on circuit theory and experimental measurements. If necessary, purely experimental determination may be made with the use of variable impedances and manual or automated testing and adjustment procedures.

TABLE 1

COMBLINE COUPLED CIRCULAR ROD FILTER

.8200 GHZ CENTER FREQUENCY
.0600 GHZ BANDWIDTH
.00 DB RIPPLE
3 SECTIONS
1.0000 INCH GROUNDPLANE SPACING
1.00 DIELECTRIC CONSTANT
50.00 OHM ROUND ROD INPUT LINE OF DIAMETER .5533 INCHES
45.000 DEGREES RESONATOR LENGTH
1.000 SLOWING FACTOR FOR COUPLED LINES
.750 INCHES FROM EDGE OF END ROD TO SIDE WALL
74.00 OHMS INTERNAL IMPEDANCE

| ELEMENT VALUE | ZOE OHMS | ZOO OHMS | LENGTH INCHES | DIAMETER INCHES | EDGE TO EDGE | END CAP PF |
|---|---|---|---|---|---|---|
| 1.0000 | 86.98 | | 1.799 | .3923 | | |
| 1.0000 | 86.98 | 30.66 | 1.799 | .4179 | .1769 | 3.16 |
| 2.0000 | 86.98 | 64.40 | 1.799 | .3573 | .5980 | 2.61 |
| 1.0000 | 86.98 | 64.40 | 1.799 | .4179 | .5980 | 3.16 |
| 1.0000 | 86.98 | 30.66 | 1.799 | .3923 | | |

LOAD IMPEDANCE = 50.000 OHMS, WITH A DIAMETER = .553 INCHES

TABLE 2

COMBLINE COUPLED CIRCULAR ROD FILTER 1.6100 GHZ CENTER FREQUENCY
.0600 GHZ BANDWIDTH
.00 DB RIPPLE
3 SECTIONS
1.0000 INCH GROUNDPLANE SPACING
1.00 DIELECTRIC CONSTANT
50.00 OHM ROUND ROD INPUT LINE OF DIAMETER .5533 INCHES
45.000 DEGREES RESONATOR LENGTH
1.000 SLOWING FACTOR FOR COUPLED LINES

TABLE 2-continued

.750 INCHES FROM EDGE OF END ROD TO SIDE WALL
74.00 OHMS INTERNAL IMPEDANCE

| ELEMENT VALUE | ZOE OHMS | ZOO OHMS | LENGTH INCHES | DIAMETER INCHES | EDGE TO EDGE | END CAP PF |
|---|---|---|---|---|---|---|
| 1.0000 | 80.02 |       | .916 | .4075 |       |      |
| 1.0000 | 80.02 | 36.78 | .916 | .4207 | .2600 | 1.58 |
| 2.0000 | 80.02 | 68.82 | .916 | .3649 | .8138 | 1.33 |
| 1.0000 | 80.02 | 68.82 | .916 | .4207 | .8138 | 1.58 |
| 1.0000 | 80.02 | 36.78 | .916 | .4075 | .2600 |      |

LOAD IMPEDANCE = 50.000 OHMS, WITH A DIAMETER= .553 INCHES

TABLE 3

COMBLINE COUPLED CIRCULAR ROD FILTER 2.4600 GHZ CENTER FREQUENCY
.0600 GHZ BANDWIDTH
.00 DB RIPPLE
3 SECTIONS
1.0000 INCH GROUNDPLANE SPACING
1.00 DIELECTRIC CONSTANT
50.00 OHM ROUND ROD INPUT LINE OF DIAMETER .5533 INCHES
45.000 DEGREES RESONATOR LENGTH
1.000 SLOWING FACTOR FOR COUPLED LINES
.750 INCHES FROM EDGE OF END ROD TO SIDE WALL
74.00 OHMS INTERNAL IMPEDANCE

| ELEMENT VALUE | ZOE OHMS | ZOO OHMS | LENGTH INCHES | DIAMETER INCHES | EDGE TO EDGE | END CAP PF |
|---|---|---|---|---|---|---|
| 1.0000 | 77.80 |       | .600 | .4082 |       |      |
| 1.0000 | 77.80 | 41.24 | .600 | .4162 | .3241 | 1.01 |
| 2.0000 | 77.80 | 70.56 | .600 | .3665 | .9521 | .871 |
| 1.0000 | 77.80 | 70.56 | .600 | .4162 | .9521 | 1.01 |
| 1.0000 | 77.80 | 41.24 | .600 | .4082 | .3241 |      |

LOAD IMPEDANCE= 50.000 OHMS, WITH A DIAMETER = .553 INCHES

Information regarding known conventional techniques regarding microwave amplifier linearizers or combline filters or microwave frequency multiplexors may be found in more detail in the reference publications and patents listed in the Bibliography below.

From the foregoing explanation and description, it will be understood that the apparatus according to the invention provides a microwave amplifier linearizer of novel structure and function which provides superior performance in terms of elimination of intermodulation distortion while preserving desired qualities of high power level pass band frequency and the like. It should be appreciated that the particular apparatus for implementing the invention in a waveguide transmission line structure is subject to numerous variations to adapt it to different circumstances and requirements and, particularly, the use of waveguide transmission line is not critical and other forms of transmission line can be employed, in which case other forms of high Q resonators, such as dielectric resonators or the like, would act as equivalents to the waveguide tuned rod resonators illustrated. Furthermore, the particular example of a three-filter structure each having three resonators, while preferred for the particular purpose illustrated, is subject to wide variation in that four or even more filters could be employed for more complete reduction of harmonic frequency orders greater than three. Also, any or all of the filter branches of a particular linearizer could have a lesser or greater number of resonator circuits than the three shown and described in the illustrated embodiments. Other variations and modifications with respect to the apparatus of the invention shown, described or suggested above will be apparent to those of skill in the art and, accordingly, the scope of the invention is not to be considered limited to the particular embodiments shown, described or suggested, but is rather to be determined by reference to the appended claims.

APPENDIX/BIBLIOGRAPHY
U.S. PATENT DOCUMENTS

| | | | |
|---|---|---|---|
| 2,438,913 | 4/1948 | Hansen | U.S. Cl. 178/44 |
| 3,818,389 | 6/1974 | Fisher | U.S. Cl. 333/73 |
| 4,091,344 | 5/1978 | LaTourette | U.S. Cl. 333/73 |
| 4,223,287 | 9/1980 | Nishikawa et al. | U.S. Cl. 333/206 |
| 4,571,553 | 2/1986 | Yokoyama | U.S. Cl. 330/149 |
| 4,578,656 | 3/1986 | Lacour et al. | U.S. Cl. 333/204 |
| 4,580,105 | 4/1986 | Myer | U.S. Cl. 330/149 |
| 4,672,452 | 6/1987 | Corbel et al. | U.S. Cl. 358/187 |
| 4,739,280 | 4/1988 | Noro | U.S. Cl. 336/149 |
| 5,023,579 | 6/1991 | Bentivenga et al. | U.S. Cl. 333/203 |
| 5,025,235 | 6/1991 | Pramanick | U.S. Cl. 333/204 |
| 5,038,113 | 6/1991 | Katz et al. | U.S. Cl. 330/277 |
| 5,066,933 | 11/1991 | Komeda | U.S. Cl. 333/204 |
| 5,237,288 | 8/1993 | Cleveland | U.S. Cl. 330/107 |

OTHER PUBLICATIONS
David G. Haigh, "Circuit Techniques for Efficient Linearised GaAs MMIC'S", 1991, IEEE MTT Microwave Symposium; Albuquerque, New Mexico; June 1-3, 1992, pp. 177-178.

APPENDIX/BIBLIOGRAPHY
U.S. PATENT DOCUMENTS

Allen Katz, "Passive Fet MMIC Linearizers for C, X and Ku- Band Satellite Applications", IEEE Microwave Monolithic Circuits Symposium, Atlanta, Georgia; June 14–15, 1993, pp. 155–158.

Alan Conrad, "Software Sorts Dielectric-Filter Requirements", Microwaves & RF, April 1994; p. 209.

What is claimed is:

1. A linearizer for a microwave amplifier having a predetermined output center frequency particularly adapted to reduce harmonic distortion and intermodulation distortion from said amplifier comprising:

a first combline filter having a waveguide configuration and including a plurality of series-connected high Q resonators;

a second combline filter having a waveguide configuration and including a plurality of series-connected high Q resonators;

a third combline filter having a waveguide configuration and including a plurality of series-connected high Q resonators;

said first, second and third filters being electrically connected in parallel with the common input therefor being adapted to receive the output from said amplifier;

the center frequency of said second filter being approximately an integral multiple of said output center frequency and the center frequency of said third filter being higher than that of said second filter and being approximately an integral multiple of said output center frequency;

an impedance element having a selectable impedance value connected as a load at the output of said second filter; and, an impedance element having a selectable impedance value connected as a load at the output of said third filter;

the impedance of each said impedance element being selected to operate in conjunction with the filter with which it is associated to tend to cause cancellation of harmonic frequency output power of said amplifier;

whereby the presence of distortion produced harmonic frequencies and of intermodulation distortion in the output of said first filter is substantially reduced.

2. A linearizer as recited in claim 1 wherein said second filter and said third filter each has at least three series-connected high Q resonators.

3. A linearizer as recited in claim 2 wherein said first filter has a stop band in the second harmonic zone of said output center frequency.

4. A linearizer as recited in claim 1 wherein each said filter is a band-pass filter with a pass band not more than about 0.4 times the center frequency of said filter.

5. A linearizer as recited in claim 1 wherein at least one of said filters is a band-pass filter with a plurality of tunable rod resonators electrically in series.

6. A linearizer for a microwave frequency amplifier particularly adapted to reduce harmonic distortion and intermodulation distortion from said amplifier comprising:

a first filter having a low insertion loss for said microwave frequency including a plurality of series-connected high Q resonators;

a second band-pass filter including a plurality of series-connected high Q resonators;

said first and second filters being electrically connected in parallel with the common input therefor being adapted to receive the output from said amplifier;

the center frequency of said second filter being approximately an integral multiple of said microwave frequency; and, an impedance element having a selectable impedance value connected as a load at the output of said second filter;

the impedance of said impedance element being selected to operate in conjunction with the filter with which it is associated to tend to cause cancellation of harmonic frequency output power of said amplifier;

whereby the presence of distortion produced harmonic frequencies and of intermodulation distortion in the output of said first filter is substantially reduced.

7. A linearizer as recited in claim 6 wherein said first filter and said second filter each has at least three series-connected high Q resonators.

8. A linearizer as recited in claim 7 wherein said first filter has a stop band in the second harmonic zone of said microwave frequency.

9. A linearizer as recited in claim 6 wherein each said filter is a band-pass filter with a pass band not more than about 0.4 times the center frequency of said filter.

10. A linearizer as recited in claim 9 further including a third band-pass filter with a center frequency higher than that of said second filter and being approximately an integral multiple of said microwave frequency.

11. A linearizer as recited in claim 6 wherein at least one of said filters is a waveguide type filter with a plurality of tunable rod resonators electrically in series.

12. The method of linearizing output of an RF amplifier having a predetermined output center frequency reducing harmonics and intermodulation distortion in said output comprising the steps of:

1) providing said output to a plurality of filters each with at least one high Q resonator, a fundamental output port for a first one of said filters, and at least one substantially isolated harmonic frequency output port for a further one of said filters;

2) causing the output of said at least one substantially isolated harmonic frequency output port to be terminated in an impedance constituting a mismatch for the self-impedance of the associated filter and producing a load mismatch for said at least one harmonic frequency appearing at said at least one harmonic frequency output port; and 3) providing the output from said fundamental output port to a utilization device with a self-impedance substantially matching the self-impedance of said fundamental output port;

whereby said impedance mismatch effectively cancels harmonic output of said RF amplifier and reduces the intermodulation distortion in the output thereof.

13. The method as recited in claim 12 wherein said filter having a fundamental output port has a stop band in the second harmonic zone of said output center frequency.

14. The method as recited in claim 12 wherein each said filter is a band-pass filter with a pass band not more than about 0.4 times the center frequency of said filter.

15. The method as recited in claim 13 wherein said output is provided to at least three filters, two of said filters each with a distinctive center frequency approximately an integral multiple of said output center frequency.

16. The method of linearizing output of an RF amplifier having a predetermined output center frequency particularly suited to a microwave application frequency thereby reducing harmonics and intermodulation distortion in said output comprising the steps of:

1) providing said output through a transmission line of predetermined length to a plurality of parallel-connected filters each having at least one high Q resonator, a fundamental output port for a first one of said filters, and at least one substantially isolated harmonic frequency output port for a further one of said filters;

2) causing the output of said at least one substantially isolated harmonic frequency output port to be terminated in an impedance constituting a mismatch for the self-impedance of the associated filter and producing a load mismatch for said at least one harmonic frequency appearing at said at least one harmonic frequency output port;

3) providing the fundamental output of said filter to a utilization device with a self-impedance substantially matching the self-impedance of said fundamental output port;

whereby said load mismatch effectively cancels harmonic output of said RF amplifier and reduces the intermodulation distortion in the output thereof.

17. The method as recited in claim 16 wherein said filter having a fundamental output port has a stop band in the second harmonic zone of said output center frequency.

18. The method as recited in claim 16 wherein each said filter is a band-pass filter with a pass band not more than about 0.4 times the center frequency of said filter.

19. The method as recited in claim 16 wherein at least one of said filters is a waveguide type filter with a plurality of tunable rod resonators electrically in series.

* * * * *